United States Patent
Cho et al.

(10) Patent No.: US 12,520,445 B2
(45) Date of Patent: Jan. 6, 2026

(54) DISPLAY DEVICE

(71) Applicant: LG ELECTRONICS INC., Seoul (KR)

(72) Inventors: Shinhyun Cho, Seoul (KR); Cheolsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 157 days.

(21) Appl. No.: 18/289,811

(22) PCT Filed: Jun. 2, 2022

(86) PCT No.: PCT/KR2022/007833
§ 371 (c)(1),
(2) Date: Nov. 7, 2023

(87) PCT Pub. No.: WO2022/260347
PCT Pub. Date: Dec. 15, 2022

(65) Prior Publication Data
US 2024/0260202 A1  Aug. 1, 2024

(30) Foreign Application Priority Data
Jun. 7, 2021 (KR) .......... 10-2021-0073429

(51) Int. Cl.
*H05K 5/30* (2025.01)
(52) U.S. Cl.
CPC .................. *H05K 5/30* (2025.01)
(58) Field of Classification Search
USPC .......................................... 361/807
See application file for complete search history.

(56) References Cited

U.S. PATENT DOCUMENTS

| | | | |
|---|---|---|---|
| 2012/0072167 A1* | 3/2012 | Cretella, Jr. | G06F 9/00 702/150 |
| 2019/0037712 A1* | 1/2019 | Kim | A47F 5/0876 |
| 2019/0059166 A1* | 2/2019 | Habeck | H05K 1/181 |
| 2020/0375041 A1* | 11/2020 | Lee | G09F 9/33 |
| 2020/0389987 A1* | 12/2020 | Kanno | G09F 13/0445 |

FOREIGN PATENT DOCUMENTS

| | | |
|---|---|---|
| JP | 6425858 B1 | 11/2018 |
| KR | 10-2019-0092968 A | 8/2019 |
| KR | 10-2020-0023188 A | 3/2020 |
| KR | 10-2020-0144709 A | 12/2020 |
| WO | WO 2018/207273 A1 | 11/2018 |

* cited by examiner

*Primary Examiner* — Hung S. Bui
(74) *Attorney, Agent, or Firm* — Birch, Stewart, Kolasch & Birch, LLP

(57) ABSTRACT

A display device includes: a display module; a frame positioned at the rear side of the display module; a displacement control unit which is positioned between the display module and the frame and of which a position in a front/rear direction on the frame changes according to a rotational direction thereof; a rotating magnet rotatably coupled to the rear surface of the display module and attached to the displacement control unit, wherein when the rotating magnet rotates, the displacement control unit rotates and moves in the front/rear direction. According to the display device, a height difference between display modules arranged adjacent to each other can be easily adjusted.

12 Claims, 18 Drawing Sheets

(a)

(b)

(a)

(b)

(a)

(b)

(a)

(b)

DISPLAY DEVICE

CROSS REFERENCE TO RELATED APPLICATIONS

This application is the National Phase of PCT International Application No. PCT/KR2022/007833, filed on Jun. 2, 2022, which claims priority under 35 U.S.C. 119 (a) to Patent Application No. 10-2021-0073429, filed in the Republic of Korea on Jun. 7, 2021, all of which are hereby expressly incorporated by reference into the present application.

TECHNICAL FIELD

The present disclosure relates to a multi-display device.

BACKGROUND

Digital signage is a communication tool that can induce marketing, advertising, training effects and customer experience of companies. It is a display device that provides specific information as well as broadcast programs in public places such as airports, hotels, hospitals, and subway stations.

The digital signage is a medium that displays various content and commercial advertisements by installing display devices such as a liquid crystal display (LCD), a plasma display panel (PDP), and an organic light emitting diode (OLED) in outdoor certain places or street furniture. The digital signage can now be installed on all moving lines, where the public moves, such as apartment elevators, subway stations, subways, buses, universities, banks, convenience stores, discount stores, shopping malls.

When configuring a single screen using a plurality of display panels or display devices, the digital signage has a problem that a screen distortion occurs due to a difference in level between adjacent display panels in an up-down direction or in a left-right direction.

DETAILED DESCRIPTION

Technical Solution

One object of the present disclosure is to solve the above-mentioned problems and other problems. Another object of the present disclosure may be to provide a multi-display device capable of adjusting a height difference or a level difference between adjacent display modules.

Technical Solution

A display device includes a display module, a frame located behind the display module, a displacement adjustment unit located between the display module and the frame and having a back-and-forth position that is changed on the frame according to a rotation direction, and a rotating magnet rotatably coupled to a rear surface of the display module and attached to the displacement adjustment unit, wherein, when the rotating magnet rotates, the displacement adjustment unit rotates and moves in a back-and-forth direction.

The rotating magnet may have a disk shape with a center in which a hole is formed, and the display device may include a non-magnetic fastener disposed through the hole of the rotating magnet and coupled to a rear surface of the display module.

The rotating magnet may have N poles and S poles alternately arranged along a circumference of a disk.

The rotating magnet may include one of 4 poles, 6 poles, or 8 poles.

The display device may further include a magnetic rod coupled to the rotating magnet by magnetic force when placed at a position of a front surface of the display module, which corresponds to the rotating magnet.

The magnetic rod may have S poles and N poles alternately arranged along an outer peripheral surface corresponding to poles of the rotating magnet.

The display device may further include a guide panel disposed on a front surface of the display module and indicating a position of the rotating magnet to guide a position of the magnet rod.

The rotating magnet may be disposed adjacent to a corner of the display module.

The guide panel may include an opening formed at a corner of the display module, which corresponds to a position of the rotating magnet, and the magnet rod may be coupled to the rotating magnet when placed in the opening.

The displacement adjustment unit may include a body part in which a spiral fastened to the frame is formed, and a head part located at an end of the body part and having a disk shape, and the head part may include a magnetic material.

The displacement adjustment unit may include a gear displacement adjustment unit having the head part with an outer peripheral surface on which a cog is formed.

The display module may further include a display panel configured to output an image, and a module cover coupled to a rear surface of the display panel, and the module cover may include a non-magnetic material.

The rotating magnets may be arranged on four corners and long sides of the display module.

Advantageous Effects

According to an embodiment of the present disclosure, it is possible to adjust a height difference or a level difference between adjacent display modules.

According to an embodiment of the present disclosure, it is possible to prevent the display screen from being distorted by adjusting the height difference or the level difference between adjacent display modules.

According to an embodiment of the present disclosure, the position on the z-axis of the displacement adjustment unit may be easily adjusted without removing the display module using a rotating magnet and a magnetic rod, thereby reducing an installation time.

According to an embodiment of the present disclosure, an accident in which the display module is damaged may be prevented during repeated attachment and detachment.

Additional scope of applicability of the disclosure will become apparent from the following detailed description. However, since various changes and modifications within the spirit and scope of the disclosure can be understood by those skilled in the art, it should be understood that specific embodiments, such as the detailed description and the preferred embodiments of the disclosure, are given as examples.

BEST MODE

Figure 1:
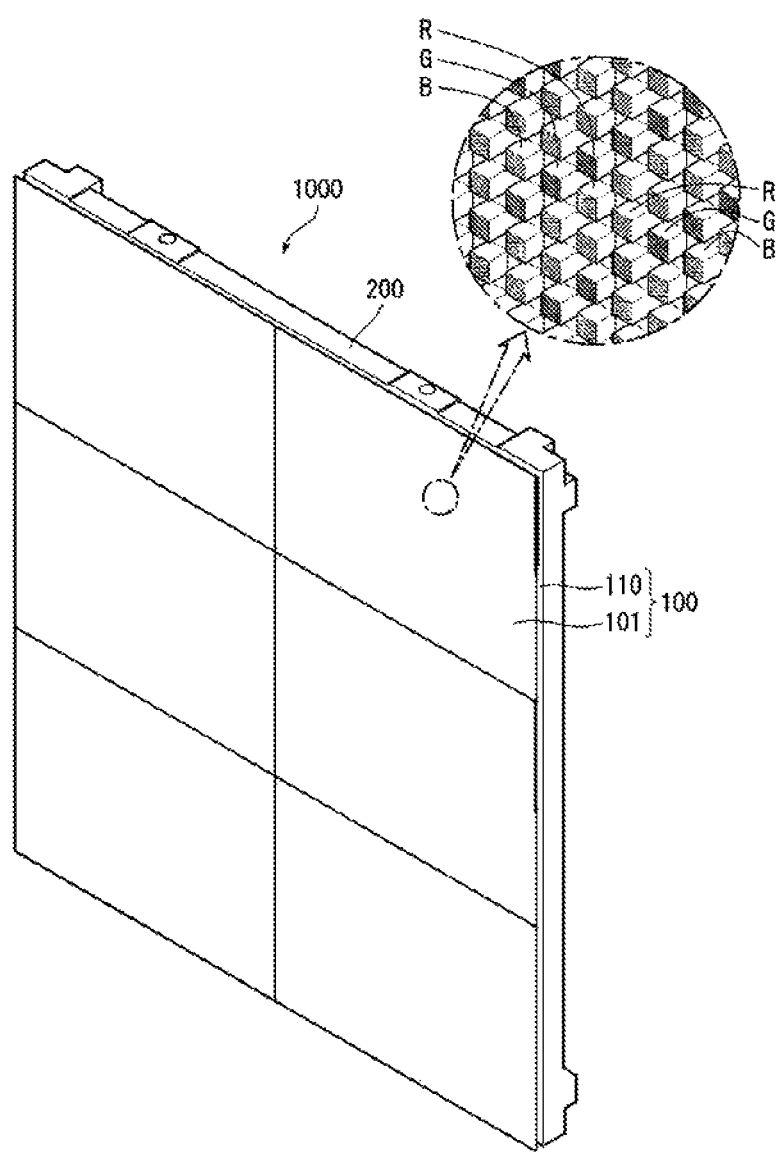
FIGS. 1 to 3 are views showing an example of a display device according to an embodiment of the present disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms "first", "second", etc. may be used to describe various components, but the components are not limited by such terms. The terms are used only for the purpose of distinguishing one component from other components.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Hereinafter, the embodiments of the disclosure are described using a Light Emitting Diode (LED) panel as an example of a display panel. Other display panels may be used. For example, an organic light emitting diode (OLED) display panel, a plasma display panel (PDP), a field emission display (FED) panel, Liquid Crystal Display (LCD) and may be used.

Figure 2:
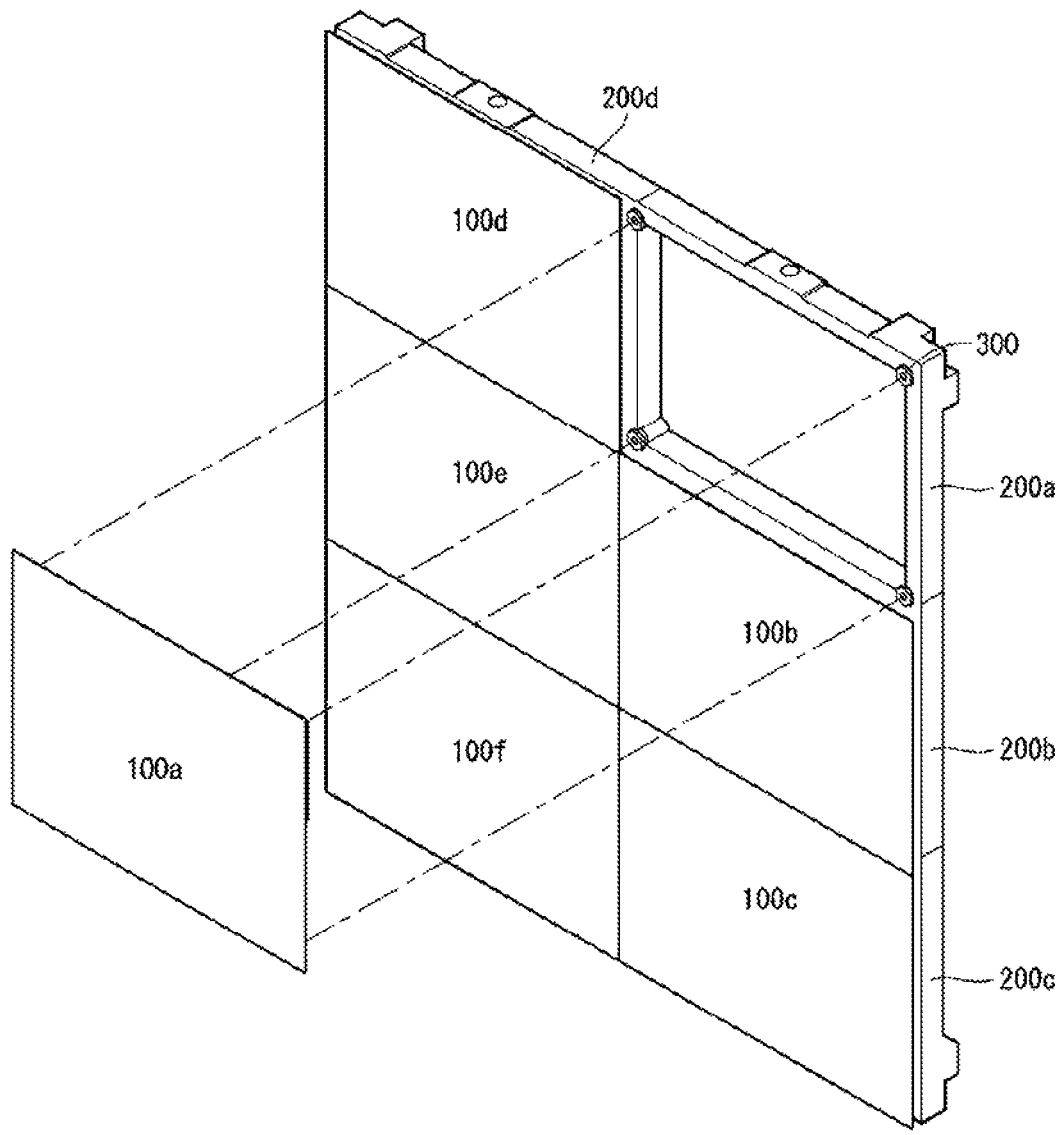

Referring to FIGS. 1 and 2, a multi-display device 1000 may include a display module 100 capable of displaying images, a frame 200 supporting the display module 100, and a displacement adjustment unit 300 mounted between the display module 100 and the frame 200 to adjust a distance therebetween.

The display module 100 may include a display panel 101 and a module cover 110 positioned behind the display panel 101.

The display panel 101 may include a plurality of pixels R, G, B. The plurality of pixels R, G, and B may be formed in each region where a plurality of data lines and a plurality of gate lines cross. The plurality of pixels R, G, B may be disposed or arranged in a matrix form.

For example, the plurality of pixels R, G, and B may include a red (R) sub-pixel, a green (G) sub-pixel, and a blue (B) sub-pixel. The plurality of pixels R, G, and B may further include a white (hereinafter, 'W') sub-pixel.

In the display panel 101, a side on which images can be observed may be referred to as a front side or a front surface. When the display panel 101 displays the images, a side on which the images cannot be observed may be referred to as a back side or a back surface. When looking at the display panel 101 from the front side or the front surface, an upper part may be referred to as an upper side or an upper surface. Similarly, a lower part may be referred to as a lower side or a lower surface. Similarly, a right part may be referred to as a right side or a right surface, and a left part may be referred to as a left side or a left surface.

The module cover 110 may be disposed behind the display panel 101 to protect the back surface of the display panel 101 from outside.

The display module 100 may include a first display module 100*a* to a sixth display module 100*f*. The first display module 100*a* to the sixth display module 100*f* may be arranged to be adjacent to each other in an up-down direction and a left-right direction.

For example, the first display module 100*a* may be disposed on an upper right side of the frame 200. The second display module 100*b* may be disposed below the first display module 100*a*. The third display module 100*c* may be disposed below the second display module 100*b*. The fourth display module 100*d* may be disposed on the left side of the first display module 100*a*. The fifth display module 100*e* may be disposed below the fourth display module 100*d* and on the left side of the second display module 100*b*. The sixth display module 100*f* may be disposed below the fifth display module 100*e* and on the left side of the third display module 100*c*.

The frame 200 may be disposed behind the plurality of display modules 100. A front surface of the frame 200 may face the back surface of the display module 100. The frame 200 may be disposed to correspond to the display module 100 in a thickness direction or a back-and-forth direction of the display module 100. The frame 200 may be formed in a frame shape in which a central region is opened. The frame 200 may be formed to be long in the up-down direction and the left-right direction so that the plurality of display modules 100 may be mounted. For example, a length of an upper side of the frame 200 may be substantially the same as a sum of a length of the upper side of the first display module 100*a* and a length of the upper side of the fourth display module 100*d*. A length of a right side of the frame 200 may be substantially the same as a sum of a length of the right side of the first display module 100*a*, a length of the right side of the second display module 100*b*, and a length of the right side of the third display module 100*c*. But it is not limited thereto. The frame 200 may be formed to be longer or shorter than the display module 100 according to an external environment such as a building or a wall to be installed.

The frame 200 may have a thickness greater than a thickness of the plurality of display modules 100.

Although one frame 200 is shown in FIGS. 1 and 2, but it is not limited thereto. The frame 200 may include a first frame 200*a* to a sixth frame 200*f*. For example, the first frame 200*a* to the sixth frame 200*f* may be stacked or assembled in substantially the same manner as the first display module 100*a* to the sixth display module 100*f* described above. Thus, the n-th display module 100 may be mounted on the n-th frame 200, where n may be a natural number.

The displacement adjustment unit 300 may be disposed between the plurality of display modules 100 and the frame 200. The displacement adjustment unit 300 may be mounted on the frame 200 in the thickness direction of the display module 100. The displacement adjustment unit 300 mounted on the front surface of the frame 200 may be attached to the back surface of the display module 100. The displacement adjustment unit 300 can adjust a distance between the back surface of the display module 100 and the front surface of the frame 200. The displacement adjustment unit 300 may be a plurality of displacement adjustment units. The displacement adjustment unit 300 may be disposed at each of corners of the frame 200. The displacement adjustment unit 300 may be disposed at each corner of the display module 100 and the frame 200, and can adjust the distance therebetween.

Figure 3:
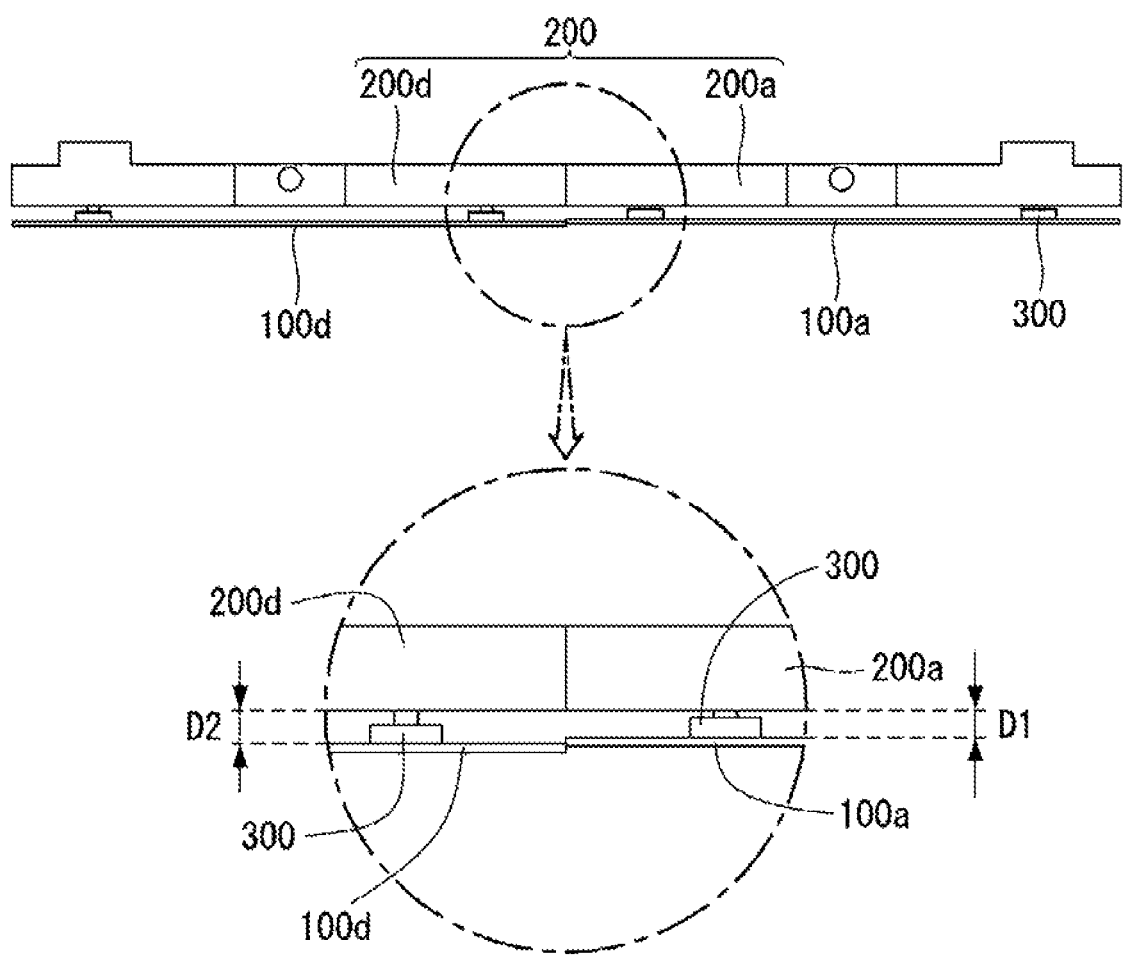

Referring to FIG. 3, a plurality of displacement adjustment units 300 may be mounted on the first frame 200 and attached to the first display module 100a. The plurality of displacement adjustment units 300 may be mounted on the fourth frame 200 and attached to the fourth display module 100d.

A distance D1 between the first display module 100a and the first frame 200a may be a right distance D1, and a distance D2 between the fourth display module 100d and the fourth frame 200 may be a left distance D2.

The displacement adjustment unit 300 may adjust one of the right distance D1 or the left distance D2, or adjust both the right distance D1 and the left distance D2 to adjust these values equally.

Thus, the displacement adjustment unit 300 can reduce a height difference or a level difference between the adjacent first display module 100a and fourth display module 100d.

Figure 4:
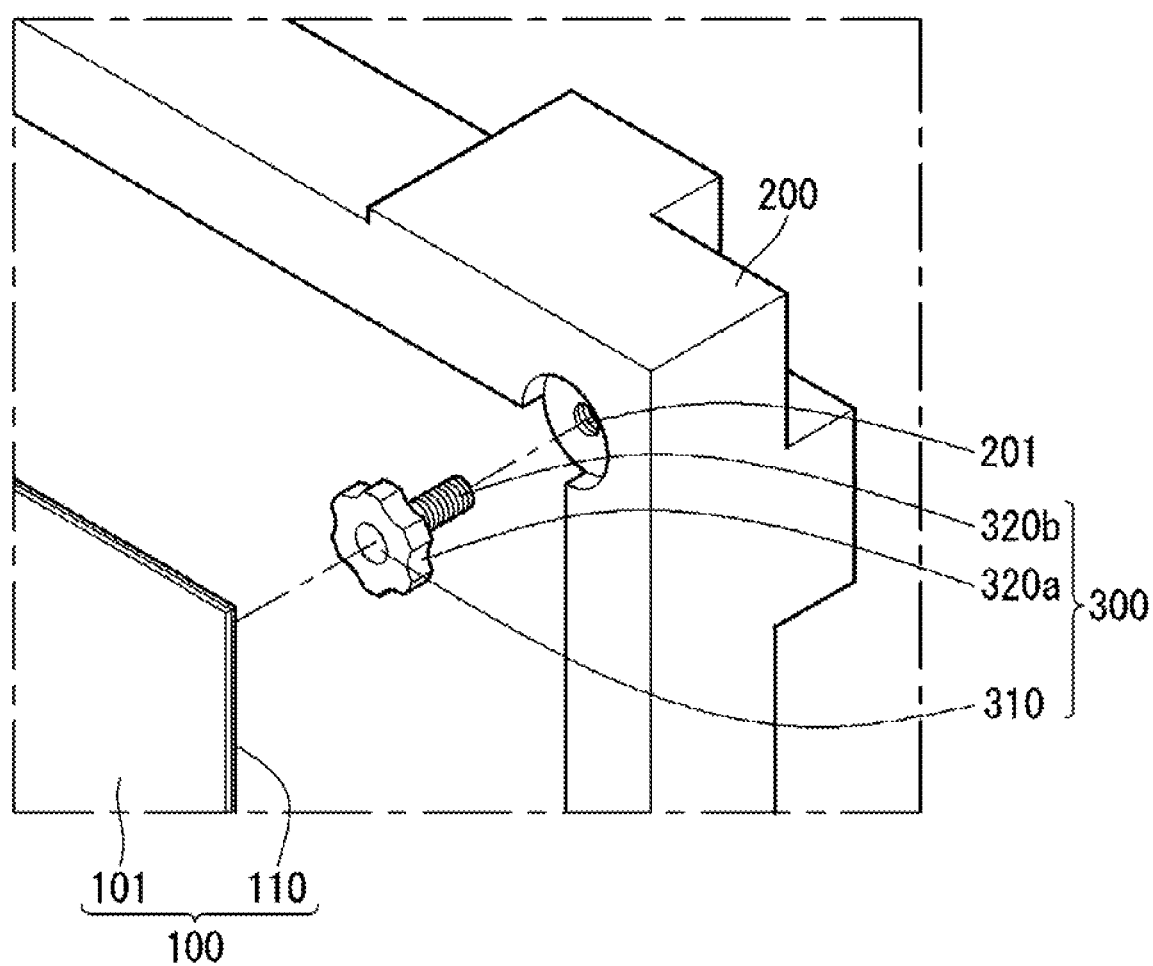
FIGS. 4 to 8 are views showing a display device according to a first embodiment of the present disclosure.
Figure 5:
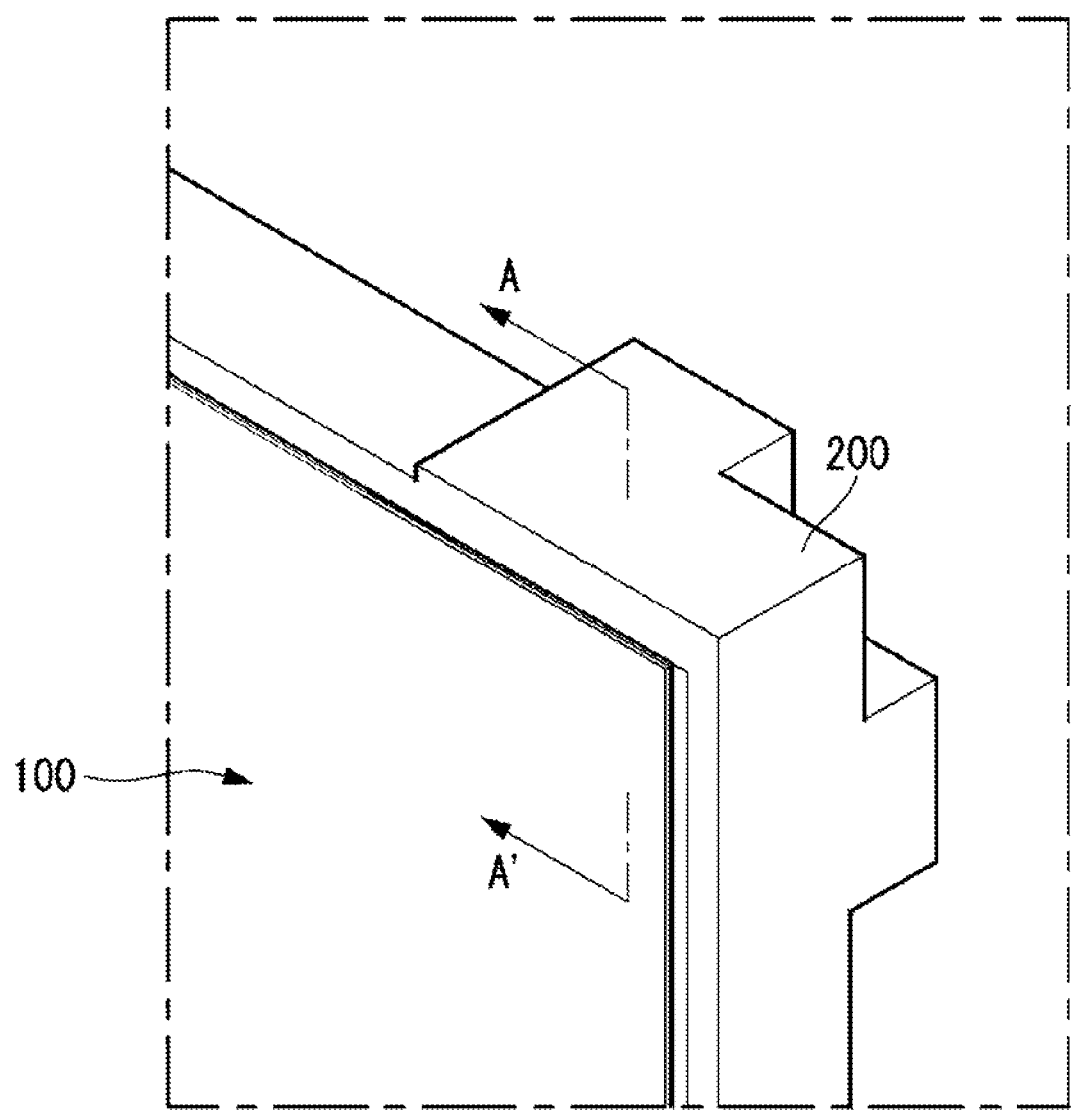
Figure 6:
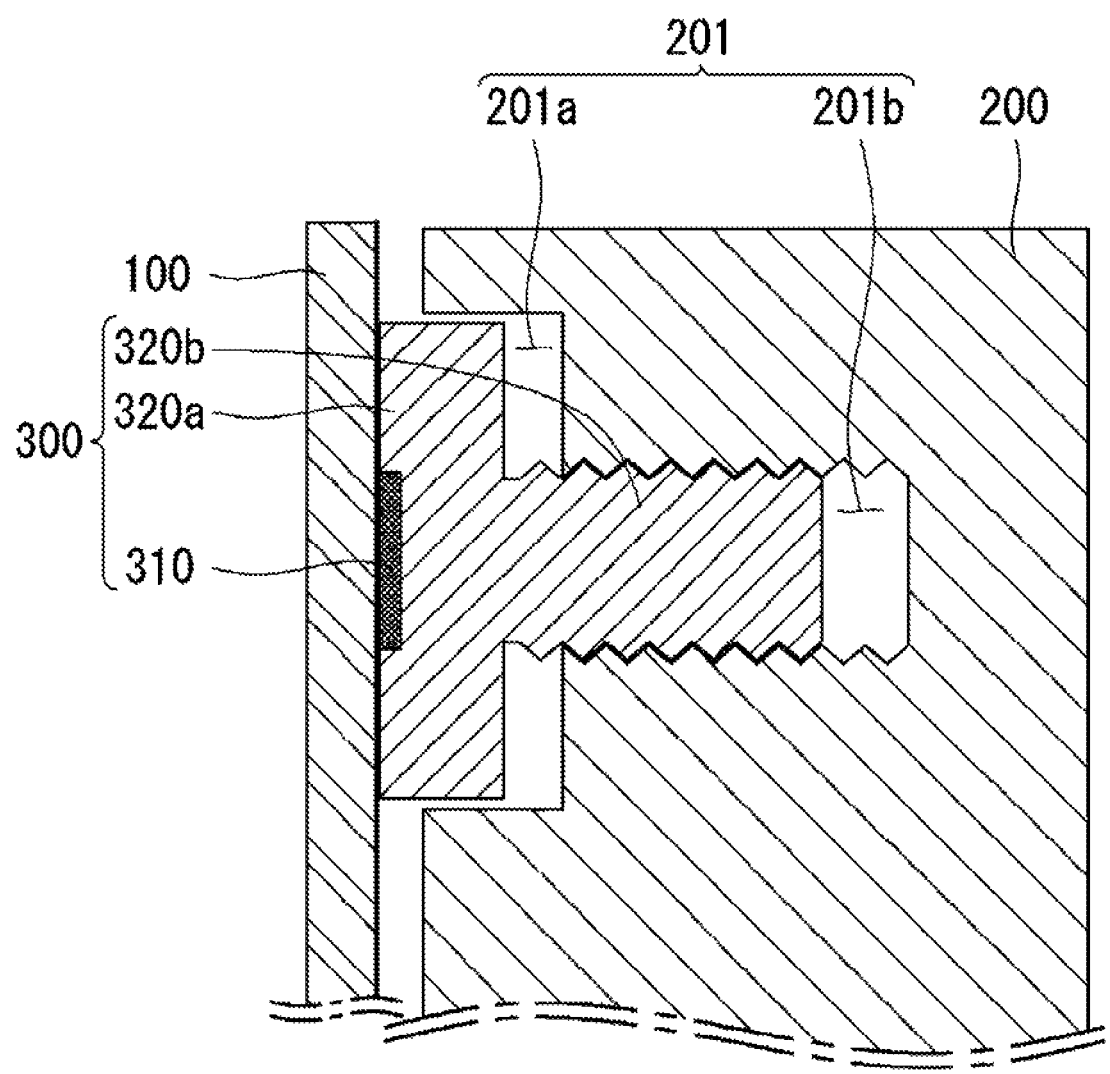

Referring to FIGS. 4 to 6, one of corners of the frame 200 is enlarged. For example, an upper right corner of the first frame 200 is enlarged. This will be mainly described below.

The displacement adjustment unit 300 may include ahead part 320a and a body part 320b.

The head part 320a may be formed as a cylinder having a predetermined diameter and a predetermined thickness. The head part 320a may include an adjustment valley. The adjustment valley may be concave toward a center line of the head part 320a. The adjustment valley may be spaced apart at regular intervals along an outer surface or outer peripheral surface of the head part 320a. An upper surface of the head part 320a may face the back surface of the display module 100.

The body part 320b may be disposed on a lower surface or a lower side surface of the head part 320a. The body part 320b may be formed to be long in the thickness direction or the back-and-forth direction from the lower surface of the head part 320a. The body part 320b may have a diameter smaller than the diameter of the head part 320a. The body part 320b may include a screw thread. The screw thread having a constant pitch may be formed on an outer peripheral surface of the body part 320b.

An attachment part 310 may be disposed on an upper surface or an upper side surface of the displacement adjustment unit 300. The attachment part 310 may be disposed on the upper surface of the head part 320a and may be attached to the back surface of the display module 100 or may be detached from the back surface of the display module 100. For example, the attachment part 310 may be a magnetic material or a double-sided tape or the like. The attachment part 310 may be referred to as an attachment part 310.

The frame 200 may include a plurality of mounting holes 201. The plurality of mounting holes 201 may be disposed on the front surface of the frame 200. At least one mounting hole 201 may be disposed in each of the corners of the frame 200. The mounting holes 201 may be concave toward a back surface of the frame 200 from the front surface of the frame 200.

The displacement adjustment unit 300 may be inserted into the mounting hole 201 and mounted to the mounting hole. The mounting hole 201 may include an upper hole 201a formed to correspond to the diameter of the head part 320a and a lower hole 201b formed to correspond to the diameter of the body part 320b.

Figure 7:
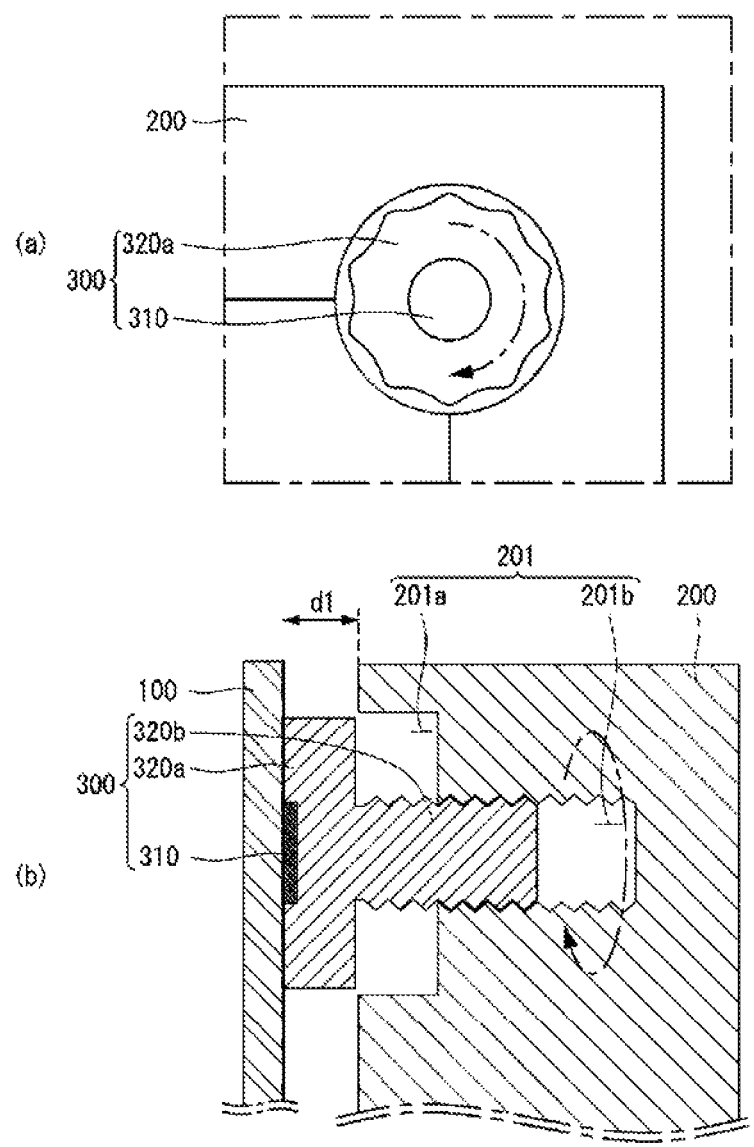
Figure 8:
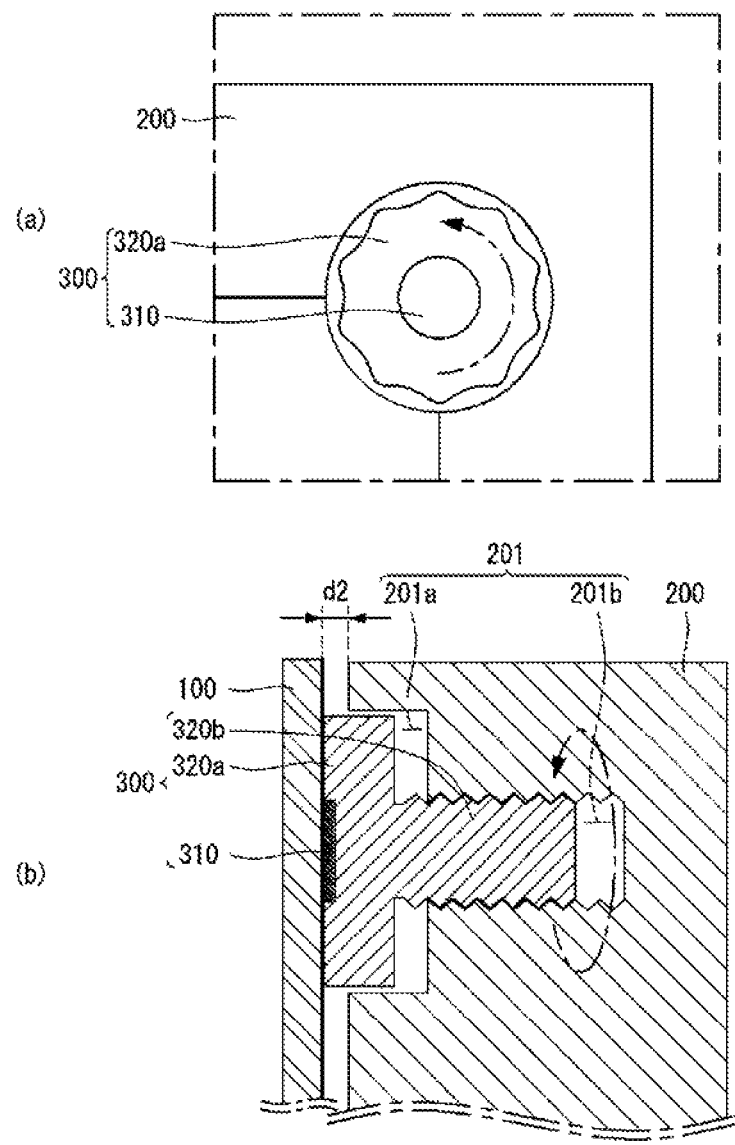

Referring to FIGS. 7 and 8, the displacement adjustment unit 300 may be rotated in a first direction or a second direction. The second direction may be opposite the first direction. The first direction may be referred to as a clockwise direction, and the second direction may be referred to as a counterclockwise direction.

As shown in FIG. 7(a), the displacement adjustment unit 300 may be rotated in the first direction. When the displacement adjustment unit 300 is rotated in the first direction, as shown in FIG. 7(b), the displacement adjustment unit 300 may protrude from the mounting hole 201 toward the display module 100. A distance between the back surface of the display module 100 and the front surface of the frame 200 may be spaced apart by a first length d1. The first length d1 may be referred to as a first distance d1. The first distance d1 may be gradually longer.

As shown in FIG. 8(a), the displacement adjustment unit 300 may be rotated in the second direction. When the displacement adjustment unit 300 is rotated in the second direction, as shown in FIG. 8(b), the displacement adjustment unit 300 may be inserted into the mounting hole 201 toward the back of the frame 200. The distance between the back surface of the display module 100 and the front surface of the frame 200 may be spaced apart by a second length d2. The second length d2 may be referred to as a second distance d2. The second distance d2 may be gradually shortened.

As described above, the distance between the display module 100 and the frame 200 can be easily adjusted as the displacement adjustment unit 300 rotates in the first direction or the second direction.

Figure 9:
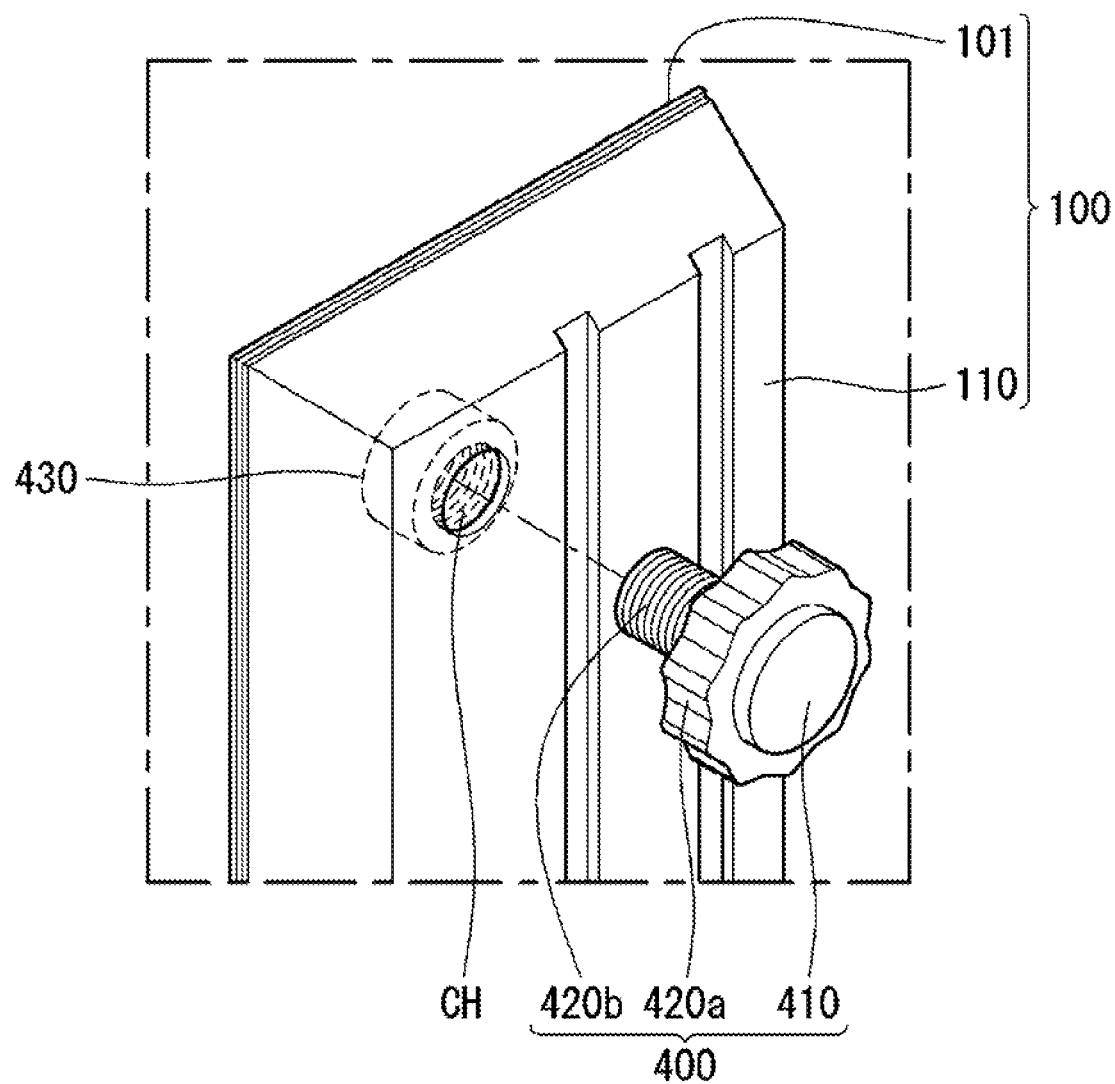
FIGS. 9 to 12 are views showing a display device according to a second embodiment of the present disclosure.
Figure 10:
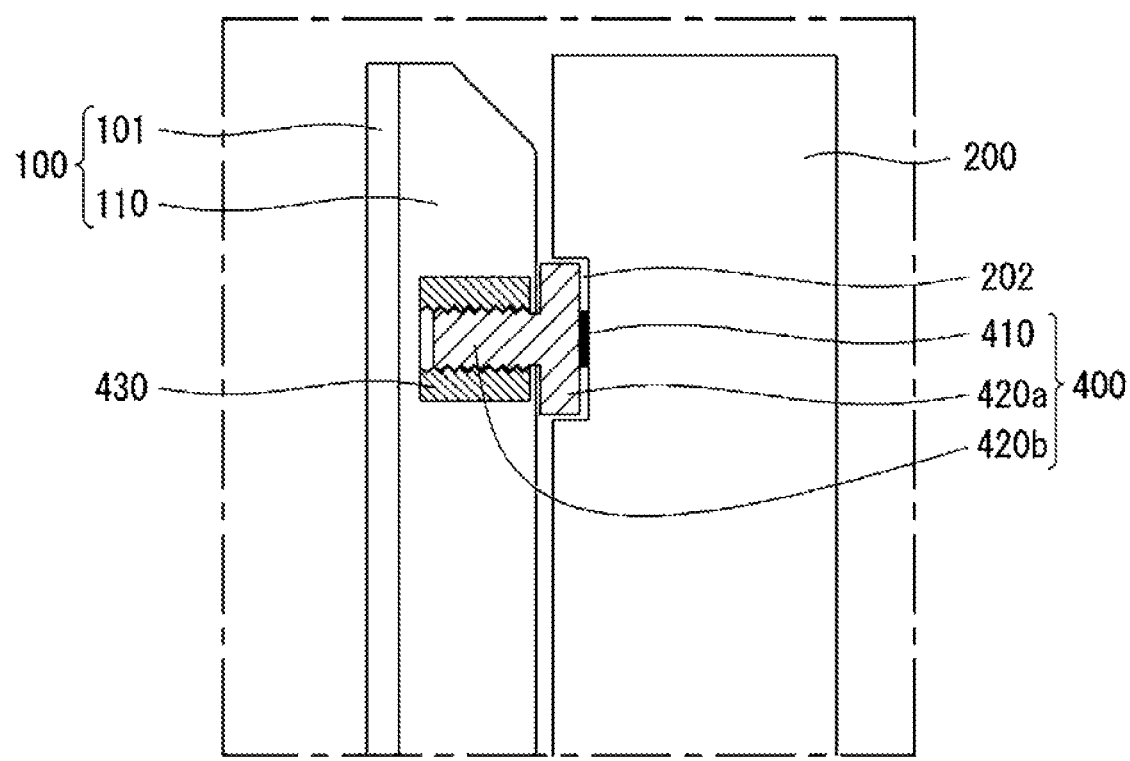

Referring to FIGS. 9 and 10, a display module 100 may include a display panel 101 and a module cover 110 disposed behind the display panel 101.

A displacement adjustment unit 400 may be mounted on the module cover 110. The displacement adjustment unit 400 may include ahead part 420a and a body part 420b.

An attachment part 410 may be disposed on an upper surface or an upper side surface of the displacement adjustment unit 400. The attachment part 410 is disposed on the upper surface of the head part 420a and may be attached to a front surface of a frame 200 or may be detached from the front surface of the frame 200. For example, the attachment part 410 may be a magnetic material or a double-sided tape or the like.

A mounting part 430 may be disposed in an inner space of the module cover 110. The mounting part 430 may have a diameter substantially equal to a diameter of the body part 420b. The mounting part 430 may include a screw thread. The screw thread having a constant pitch may be formed on an inner peripheral surface of the mounting part 430.

The module cover 110 may include a plurality of cover holes CH. The cover hole CH may penetrate the module cover 110. The cover hole CH may be disposed in the module cover 110 so as to correspond to the mounting part 430. The displacement adjustment unit 400 may be inserted into the mounting part 430 through the cover hole CH.

The frame 200 may include a plurality of frame grooves 202. The frame grooves 202 may be disposed on the front surface of the frame 200 and may be concave toward a back of the frame 200. The head part 420a of the displacement adjustment unit 400 may be inserted into the frame groove 202. The attachment part 410 may be attached to an inside of the frame groove 202.

As described above, the head part 420a of the displacement adjustment unit 400 may be attached to the frame groove 202 formed in the frame 200 through the attachment part 410, and the body part 420b of the displacement adjustment unit 400 may be inserted into the mounting part 430 built in the module cover 110 and mounted thereon.

Figure 11:
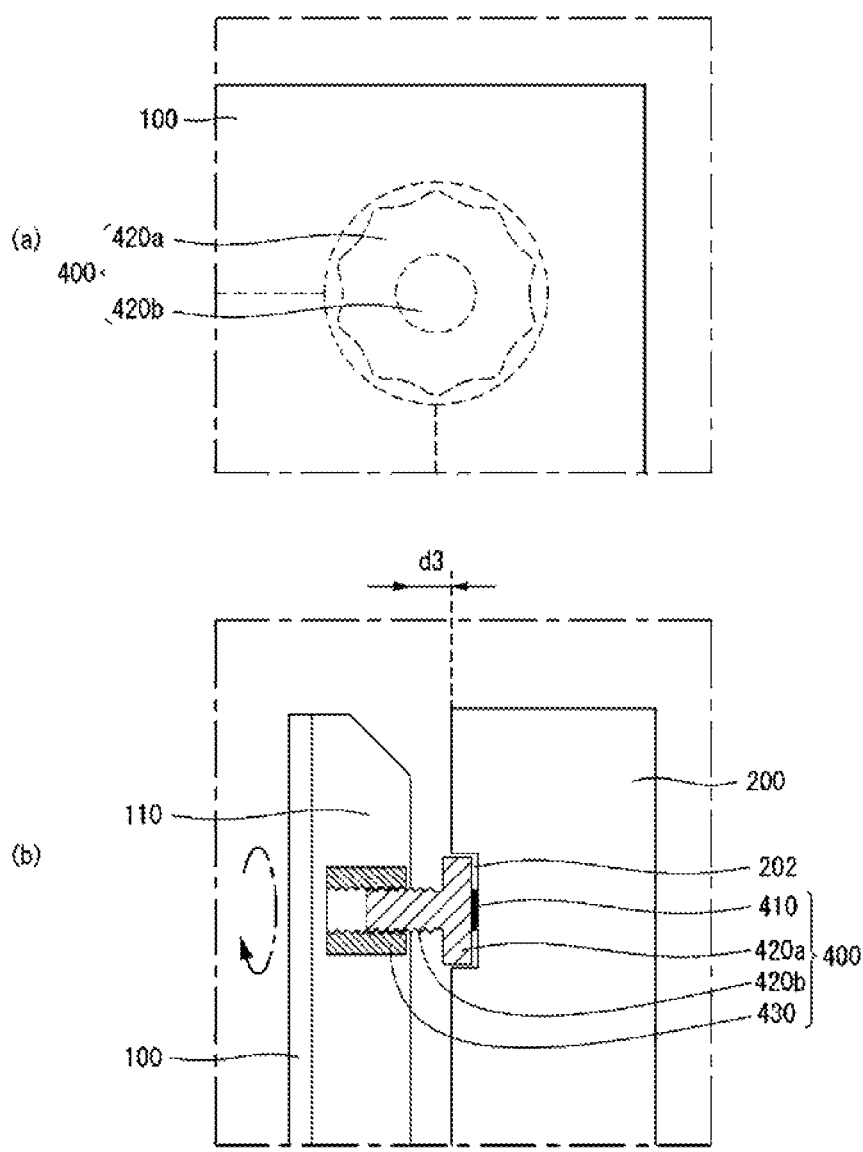
Figure 12:
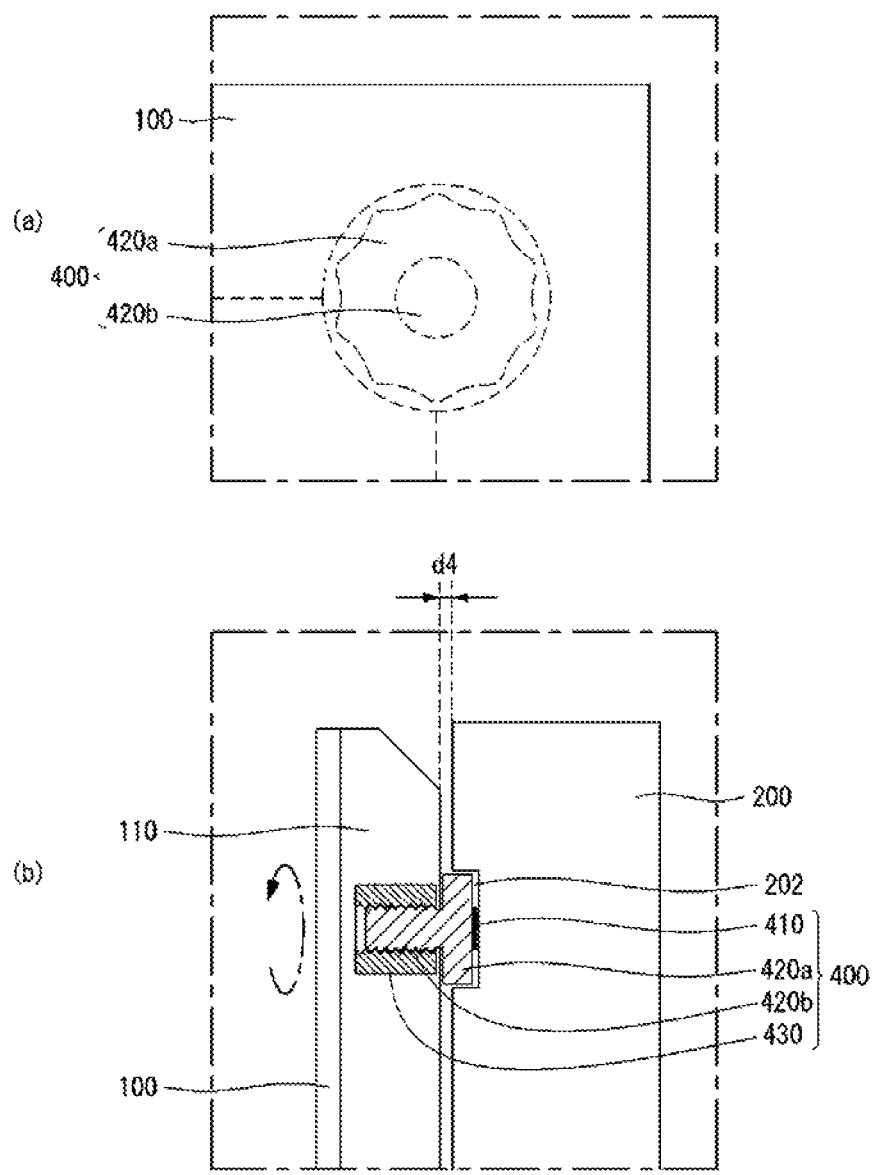

Referring to FIGS. 11 and 12, the displacement adjustment unit 400 may be rotated in a first direction or a second direction. The second direction may be opposite the first direction. The first direction may be referred to as a clockwise direction, and the second direction may be referred to as a counterclockwise direction.

As shown in FIG. 11(a), the displacement adjustment unit 400 may be rotated in the first direction. When the displacement adjustment unit 400 is rotated in the first direction, as shown in FIG. 11(b), the displacement adjustment unit 400 may protrude from the mounting part 430 toward the frame 200. A distance between the module cover 110 and the front surface of the frame 200 may be spaced apart by a third length d3. The third length d3 may be referred to as a third distance d3. The third distance d3 may be gradually longer.

As shown in FIG. 12(a), the displacement adjustment unit 400 may be rotated in the second direction. When the displacement adjustment unit 400 is rotated in the second direction, as shown in FIG. 12(b), the displacement adjustment unit 400 may be inserted into the mounting part 430 toward a front of the display module 100. The distance between the module cover 110 and the front surface of the frame 200 may be spaced apart by a fourth length d4. The fourth length d4 may be referred to as a fourth distance d4. The fourth distance d4 may be gradually shortened.

As described above, the distance between the module cover 110 and the frame 200 can be easily adjusted as the displacement adjustment unit 400 rotates in the first direction or the second direction.

Figure 13:
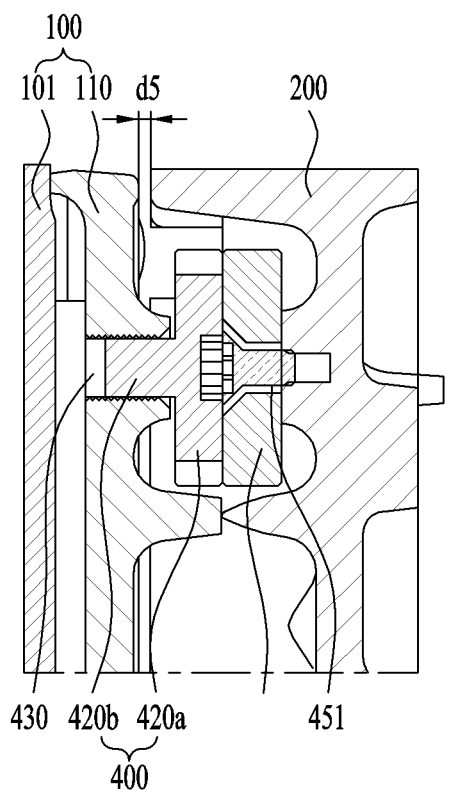
FIGS. 13 to 18 are diagrams showing a display device according to a third embodiment of the present disclosure.
Figure 13:
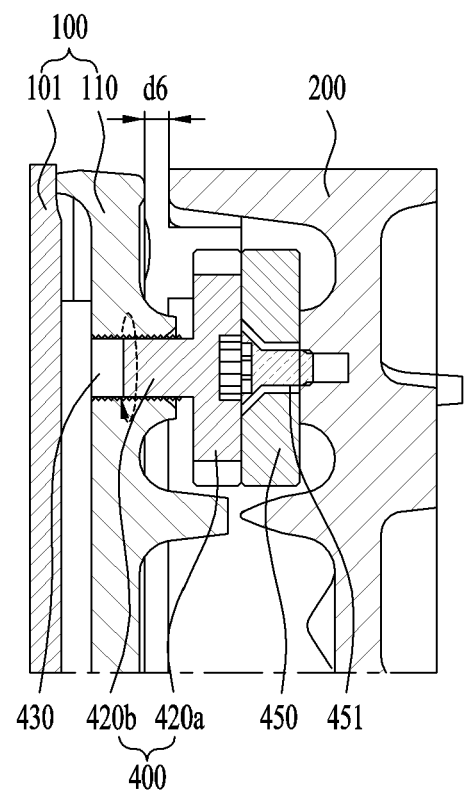

Referring to FIG. 13, the displacement adjustment unit 400 coupled to the module cover 110 located on a rear surface of the display module 100 may not include the attachment part 410, but an attachment part 450 may be provided to the frame 200. The attachment part 450 may be a magnet fixed to the frame 200, and may be fixed to the frame 200 using a screw 451, a double-sided tape, or the like.

In the embodiment of FIG. 9, the attachment part 450 may be located on the head part 420a of the displacement adjustment unit 400, and when the attachment part 450 is a magnet, the frame 200 needs to be made of a magnetic material such as a metal to be coupled by magnetic force. Because a cost increases when the frame 200 is manufactured entirely from metal such as iron, the displacement adjustment unit 400 may be made of a magnetic material such as metal, and the frame 200 includes a magnet to couple the display module 100 to the frame 200 through the displacement adjustment unit 400.

When the displacement adjustment unit 400 rotates in a first direction, the displacement adjustment unit 400 may protrude from a mounting part formed on the module cover 110 as shown in (b) of FIG. 13, and a distance between the frame 200 and the display module 100 may be increased to a sixth length d6 from a fifth length d5. When viewed from the front, the display module 100 may protrude forward.

Conversely, when the displacement adjustment unit 400 rotates in a second direction, which is opposite to the first direction, the sixth length d6 may be reduced to the fifth length d5, and thus the display module 100 may move rearward.

However, when the displacement adjustment unit 400 is fastened to the module cover 110 located on the rear surface of the display module 100, there is a problem in that a thickness of the module cover 110 is increased.

To adjust the displacement adjustment unit, there is an inconvenience of having to separate the display module 100 from the frame 200 and then adjusting the displacement adjustment unit. The number of the displacement adjustment units 300 may be at least 4 to at most 8 for each display module 100, and thus the number of operations to adjust each displacement adjustment unit 300 may increase.

Therefore, there is a problem in that a process of fastening the display module 100 of the display device to the frame 200 takes a significant portion of time to adjust a level difference with the neighboring display module 100.

As the number of attachments and detachments increases, a surface side of the display panel 101 may peel off, causing damage to a product.

Figure 14:
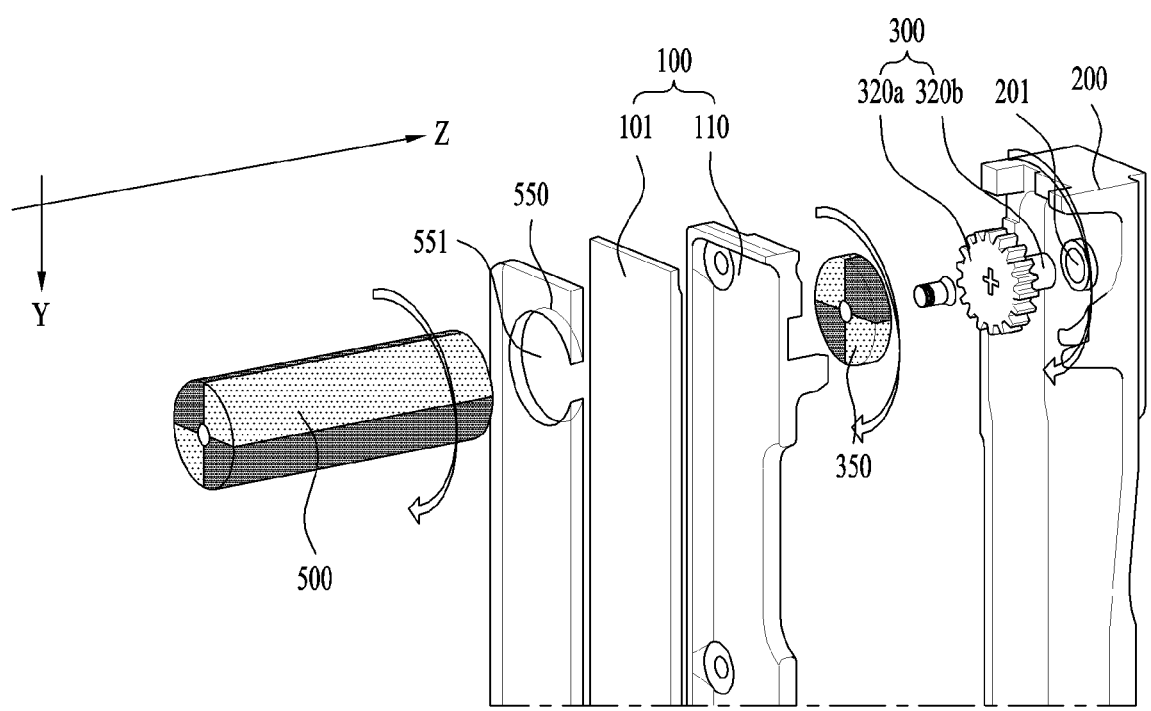

To more easily adjust the displacement adjustment unit, a rotating magnet 350 and a magnetic rod 500 may be further provided in addition to the displacement adjustment unit 300 fastened to the frame 200, as shown in FIG. 14.

Figure 15:
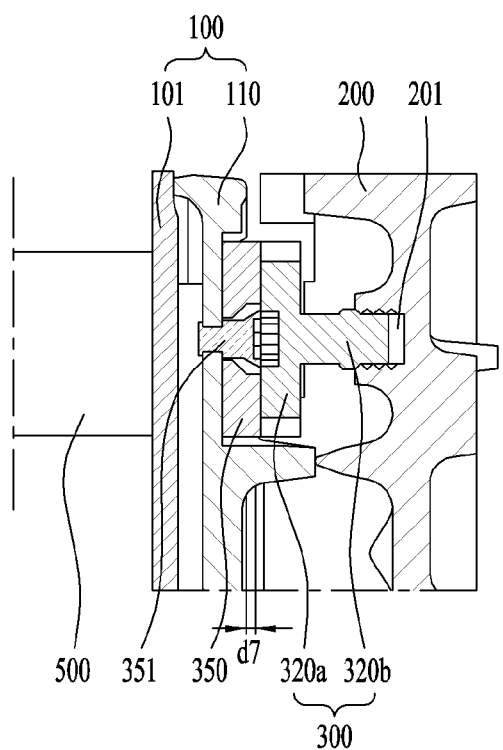
Figure 15:
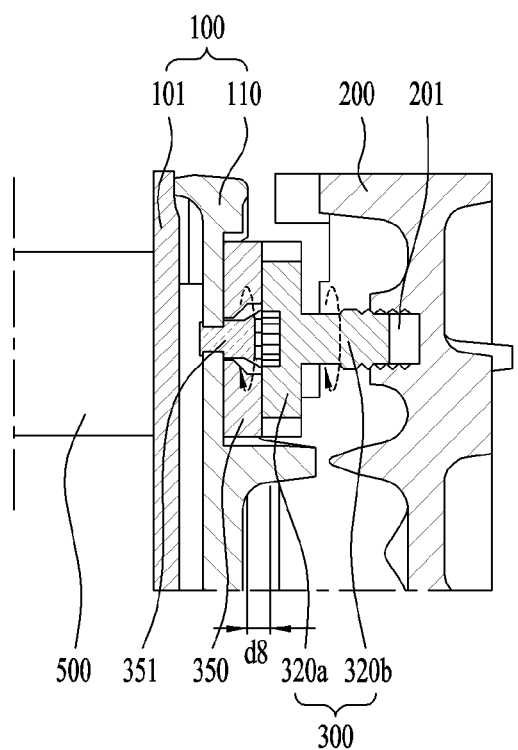

FIGS. 14 and 15 show the displacement adjustment unit 300, the rotating magnet 350, and the magnetic rod 500 that are located at a corner portion of the display module 100, FIG. 14 is an exploded perspective view, and FIG. 15 is a cross-sectional view.

The displacement adjustment unit 300 fastened to the frame 200 may include the body part 320b in which a spiral is formed and the head part 320a in a disk shape extending from an end of the body part 320b. When the displacement adjustment unit 300 rotates in the first or second direction, the displacement adjustment unit 300 may be drawn in and out from the mounting holes 201 of the frame 200.

The rotating magnet 350, which is fastened to a rear surface of the module cover 110 located on a rear surface of the display panel 101, may be rotatably coupled through a fastener such as a screw 351.

The rotating magnet 350 may have a disk shape and may be magnetic. When a hole is formed in the center of a disk and the screw 351 is fastened to the module cover 110 through the hole, the rotating magnet 350 may be rotatable and fixed in a back-and-forth direction (z-axis direction) of the display device.

The module cover 110 may be made of a non-magnetic material, and thus the rotating magnet 350 may not be attached to the module cover 110 by the magnetic force of the rotating magnet 350.

The rotating magnet 350 is instead fastened to the displacement adjustment unit 300 and rotates together. The displacement adjustment unit 300 may be made of a magnetic material such as metal to be coupled the rotating magnet 350.

The magnetic rod 500 may be a cylindrical magnet, as shown in FIG. 14, and when the magnetic rod 500 approaches a portion of a front surface of the display module 100, which corresponds to the position of the rotating magnet 350, the rotating magnet 350 may be attached to the magnetic rod 500 by magnetic force of the magnetic rod 500.

As shown in FIG. 15, when the magnetic rod 500 rotates, the rotating magnet 350 may rotates along the magnetic rod 500 and may rotate the displacement adjustment unit 300. According to a rotation direction, the displacement adjustment unit 300 may be drawn in ((a) of FIG. 15) or drawn out ((b) of FIG. 15) from the mounting hole, and a level difference between the display modules 100 may be removed.

However, when the magnetic rod 500 and the rotating magnet 350 have the same polarity along a circumference, only the magnetic rod 500 rotates while being attached and the rotating magnet 350 may not rotate.

Figure 16:
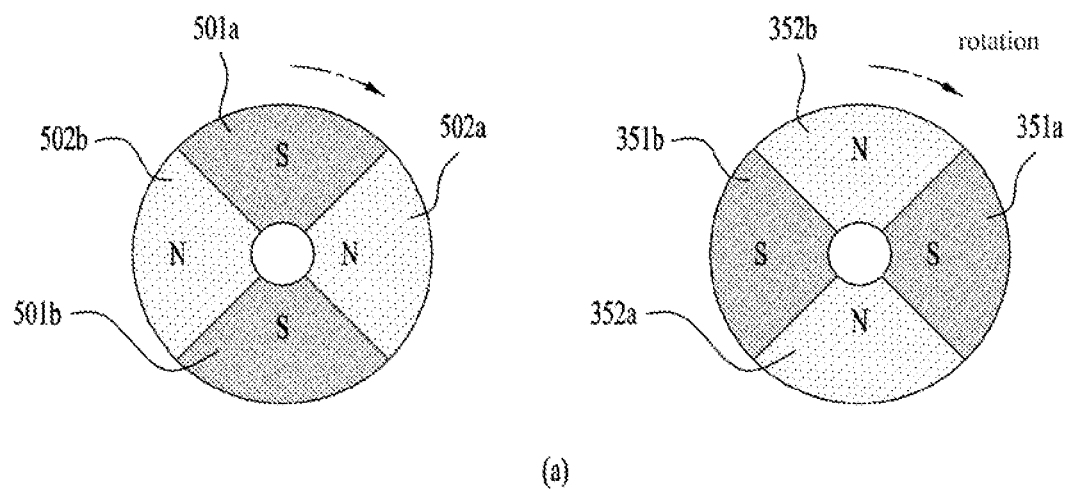
Figure 16:
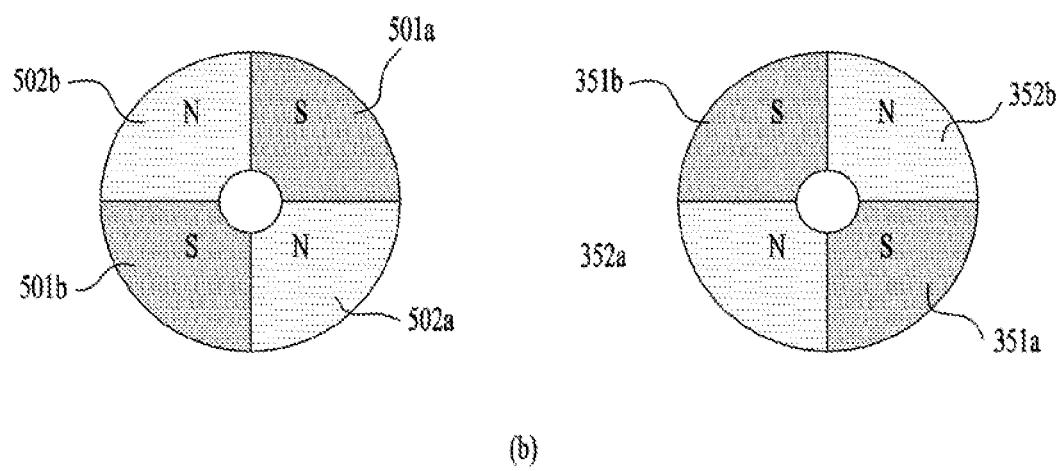

Therefore, according to the present disclosure, as shown in FIG. 16, N and the S poles may be alternately arranged along a circumference of the rotating magnet 350 and the magnetic rod 500. S poles 502a and 502b of the magnetic rod 500 and N poles 352a and 352b of the rotating magnet 350 are coupled to each other and provides a repulsive force to the S poles 351a and 351b of the rotating magnet 350. When the magnetic rod 500 rotates, the rotating magnet 350 may also rotate in the same direction as the magnetic rod 500 to avoid overlapping between the S poles 502a and 502b of the magnetic rod 500 and the S poles 351a and 351b of the rotating magnet 350.

The magnetic rod 500 and the rotating magnet 350 may be formed by magnetizing a ferromagnetic object, and the number of polarizations of the magnetic rod 500 and the number of polarizations of the rotating magnet 350 may be configured to be the same.

Figure 17:
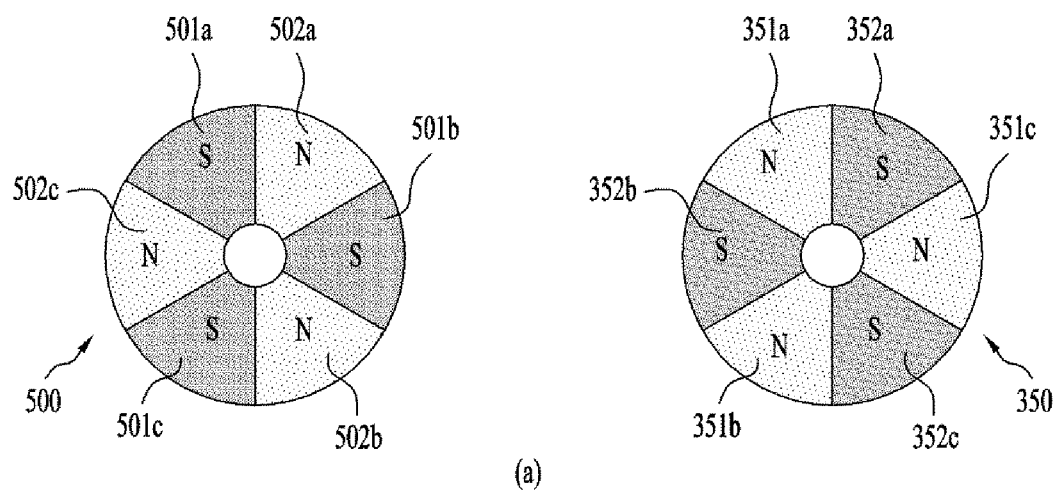
Figure 17:
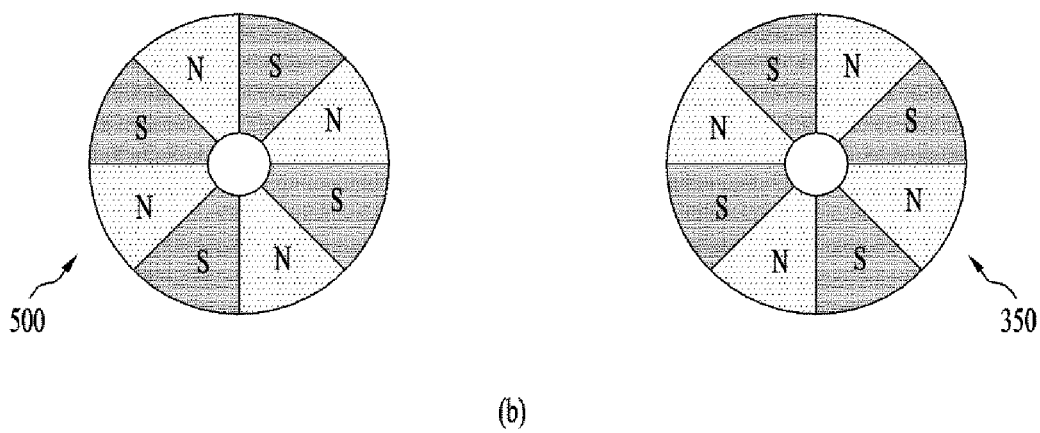

As shown in FIG. 16, two N poles and two S poles may be arranged alternately along a circumference and may be divided into four poles. Alternatively, as shown in FIG. 17, the poles may be divided into 6 or 8 poles, and because the number of N poles and the number of S poles need to be the same, the number of polarizations may be an even number.

When the number of polarizations is too small, rotation of the magnetic rod 500 and rotation of the rotating magnet 350 may not be synchronized with each other and a backlash phenomenon may occur. When the number of polarizations is too large, magnetization is difficult and during rotation of the magnetic rod 500, a cogging phenomenon may occur instead of making disk smooth, and thus it may be appropriate to divide the poles into about 4 to 8 poles.

The divided poles may have a fan shape to be arranged in uniform sizes along a circumference of the disk.

As an outer diameter of the rotating magnet 350 is increased, a magnetic force is increased, and thus as the size of the rotating magnet 350 is increased, the adhesion of the display module 100 may be increased. However, when the size of the rotating magnet 350 becomes too large, the size of the frame 200 needs to be also increased, and it may be difficult to rotate the frame 200, and thus the rotating magnet 350 may be configured to have a size of about 20 mm.

A diameter of the magnetic rod 500 may have a diameter corresponding to the size of the rotating magnet 350. The magnetic rod 500 needs to be long to provide sufficient magnetic force to rotate the rotating magnet 350, and may be configured in a cylindrical shape for convenience of adjustment. For example, the magnetic rod 500 may be configured to have a diameter of 2 cm and a length of 5 cm.

The specifications of the magnetic rod 500 and the rotating magnet 350 may vary depending on the thickness of the display module 100 and the size of the display module 100. When the thickness of the display module 100 is increased, at least one of the length or diameter of the magnetic rod 500 needs to be further increased to apply the magnetic force of the magnetic rod 500 to the rotating magnet 350.

The displacement adjustment unit 300 may adjust a position thereof by rotating through the rotating magnet 350 and the magnetic rod 500, but cogs may be formed on an outer peripheral surface of the head part 320a of the displacement adjustment unit 300 to facilitate rotation of the displacement adjustment unit 300 before the display module 100 is fastened. Alternatively, a circumference of the head part 320a may be angled to be fastened with a wrench or the like, like a pam nut, or a groove may be formed in the head part 320a such that a driver such as a cross driver is to be inserted.

To guide the position of the rotating magnet 350, a guide panel 550 disposed on a front surface of the display module 100 may be provided to guide the magnetic rod 500 having a thickness direction (z-axis direction) to be positioned in parallel to the rotating magnet 350. The guide panel 550 is a plate member that displays a portion corresponding to the rotating magnet 350 when placed along an edge or side of the display module 100, and in the present embodiment, the guide panel 550 is shown as an opening 551.

When the magnetic rod 500 is disposed on the opening 551, the rotating magnet 350 may be arranged in parallel to the magnetic rod 500, and thus when the magnetic rod 500 rotates, the rotating magnet 350 may rotate together. A moving direction of the display module 100 may be displayed on the guide panel 550 according to a rotation direction of the guide panel 550. In addition, depending on a rotation amount, a moving distance on the z-axis of the displacement adjustment unit 300 may be displayed on the guide panel 550 to easily guide adjustment of a level difference of the display modules 100.

When the plurality of rotating magnets 350 are disposed at the same distance from respective corners of the display module 100, the positions of the plurality of rotating magnets 350 may be found using one guide panel 550 and the magnetic rods 500 may be disposed.

Figure 18:
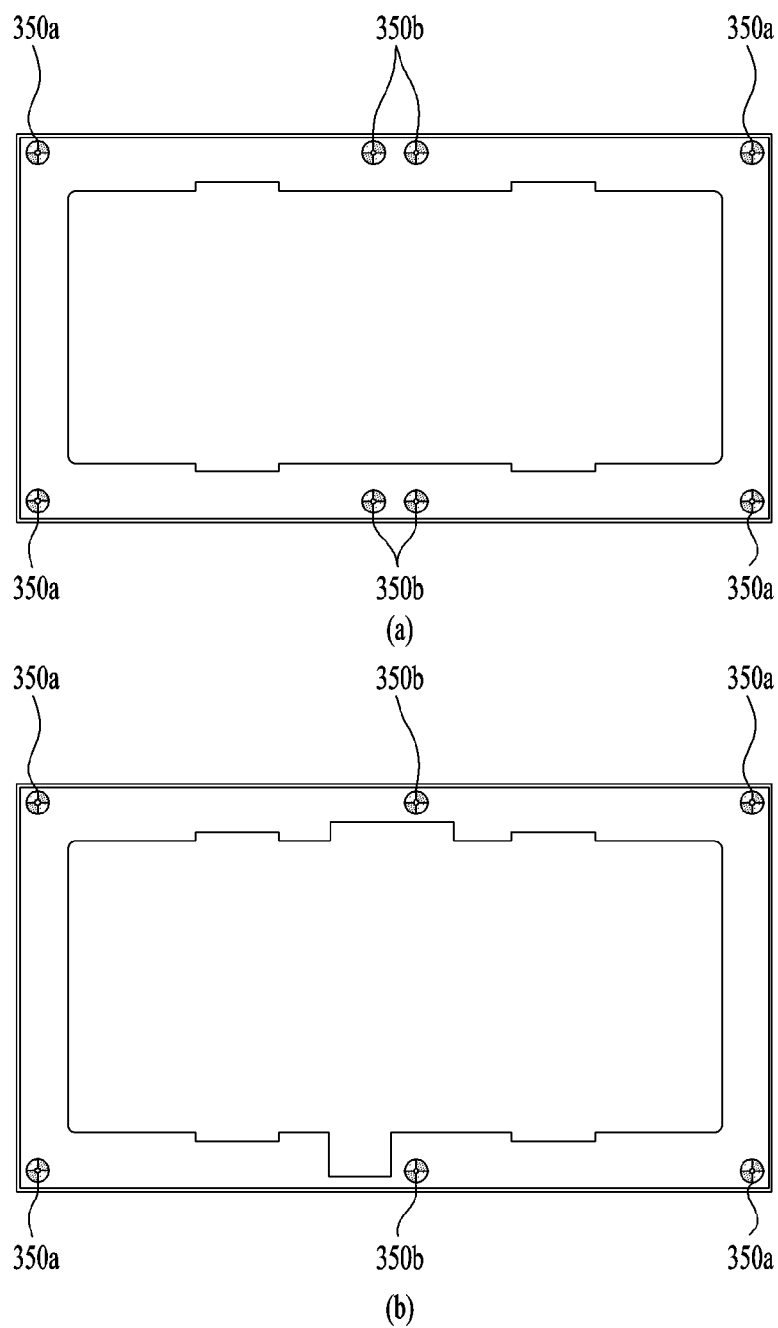

FIG. 18 is a diagram showing an example of arrangement of the rotating magnets 350 located on the frame 200, and because the display module 100 generally has a rectangular shape that is long in one direction, the displacement adjustment units 300 and rotating magnets 350a coupled thereto may be arranged at least four corners to stably fix the display module 100 to the frame 200.

When the length of one side of the display module 100 is long, a rotating magnet 350b and the displacement adjustment unit 300 may be additionally placed in the middle of the long side for more stable attachment.

According to an embodiment of the present disclosure, it is possible to adjust a height difference or a level difference between adjacent display modules 100.

According to an embodiment of the present disclosure, it is possible to prevent the display screen from being distorted by adjusting the height difference or the level difference between adjacent display modules.

According to an embodiment of the present disclosure, the position on the z-axis of the displacement adjustment unit 300 may be easily adjusted without removing the display module using the rotating magnet 350 and the magnetic rod 500, thereby reducing an installation time.

According to an embodiment of the present disclosure, an accident in which the display module 100 is damaged may be prevented during repeated attachment and detachment.

The above detailed description needs not be construed to be restrictive in any aspect and needs to be considered illustrative. The scope of the present disclosure needs to be determined by reasonable interpretation of the appended claims, and all changes within the equivalent scope of the present disclosure are included in the scope of the present disclosure.

The invention claimed is:

1. A display device comprising:
   a display module;
   a frame located behind the display module;
   a displacement adjustment unit rotatably coupled to a front surface of the frame and changing a back-and-forth position on the front surface of the frame according to a rotation direction; and
   a rotating magnet rotatably coupled to a rear surface of the display module and attached to the displacement adjustment unit,
   wherein the displacement adjustment unit includes:
      a body part in which a spiral fastened to the frame is formed; and
      a head part located at an end of the body part and having a magnetic material coupled to the rotating magnet, and
   wherein, when the rotating magnet rotates, the displacement adjustment unit rotates and moves in a back-and-forth direction on the front surface of the frame.

2. The display device of claim 1, wherein the rotating magnet has a disk shape with a center in which a hole is formed; and
   wherein the display device includes a non-magnetic fastener disposed through the hole of the rotating magnet and coupled to a rear surface of the display module.

3. The display device of claim 1, wherein the rotating magnet has N poles and S poles alternately arranged along a circumference of a disk.

4. The display device of claim 3, wherein the rotating magnet includes one of 4 poles, 6 poles, or 8 poles.

5. The display device of claim 3, further comprising:
   a magnetic rod coupled to the rotating magnet by magnetic force when placed at a position of a front surface of the display module, which corresponds to the rotating magnet.

6. The display device of claim 5, wherein the magnetic rod has S poles and N poles alternately arranged along an outer peripheral surface corresponding to poles of the rotating magnet.

7. The display device of claim 5, further comprising:
   a guide panel disposed on a front surface of the display module and indicating a position of the rotating magnet to guide a position of the magnet rod.

8. The display device of claim 7, wherein:
   the rotating magnet is disposed adjacent to a corner of the display module;
   the guide panel includes an opening formed at a corner of the display module, which corresponds to a position of the rotating magnet; and
   the magnet rod is coupled to the rotating magnet when placed in the opening.

9. The display device of claim 1, wherein the displacement adjustment unit includes a gear displacement adjustment unit having the head part with an outer peripheral surface on which a cog is formed.

10. The display device of claim 1, wherein the display module further includes:
    a display panel configured to output an image; and
    a module cover coupled to a rear surface of the display panel; and
    wherein the module cover includes a non-magnetic material.

11. The display device of claim 1, wherein the rotating magnet is arranged on four corners and long sides of the display module.

12. A display device comprising:
    a display module;
    a frame located behind the display module;
    a displacement adjustment unit located between the display module and the frame and having a back-and-forth position that is changed on the frame according to a rotation direction; and
    a rotating magnet rotatably coupled to a rear surface of the display module and attached to the displacement adjustment unit,
    wherein, when the rotating magnet rotates, the displacement adjustment unit rotates and moves in a back-and-forth direction, and
    wherein the displacement adjustment unit includes:
       a body part in which a spiral fastened to the frame is formed;
       a head part located at an end of the body part; and
       a gear displacement adjustment unit having a cog formed on an outer peripheral surface of the head part.

* * * * *